US009534506B2

(12) United States Patent
Okudera et al.

(10) Patent No.: US 9,534,506 B2
(45) Date of Patent: Jan. 3, 2017

(54) REDUCING THE INFLUENCE OF THERMAL EXPANSION OF CONNECTOR PINS ON A SUBSTRATE IN A VACUUM PUMP

(75) Inventors: Satoshi Okudera, Yachiyo (JP); Ulrich Schroder, Saint Marcel (FR); Eduardo Carrasco, Saint Marcel (FR); Benoit Henry, Saint Marcel (FR)

(73) Assignees: EDWARDS JAPAN LIMITED, Chiba (JP); SOCIETE DE MECANIQUE MAGNETIQUE, Saint Marcel (FR)

( * ) Notice: Subject to any disclaimer, the term of this patent is extended or adjusted under 35 U.S.C. 154(b) by 474 days.

(21) Appl. No.: 13/877,527

(22) PCT Filed: Jul. 28, 2011

(86) PCT No.: PCT/JP2011/067331
§ 371 (c)(1),
(2), (4) Date: Apr. 3, 2013

(87) PCT Pub. No.: WO2012/053271
PCT Pub. Date: Apr. 26, 2012

(65) Prior Publication Data
US 2013/0189090 A1    Jul. 25, 2013

(30) Foreign Application Priority Data

Oct. 19, 2010  (JP) ................. 2010-234772

(51) Int. Cl.
*F01D 5/18* (2006.01)
*F01D 5/08* (2006.01)
(Continued)

(52) U.S. Cl.
CPC .............. *F01D 25/24* (2013.01); *F04B 37/08* (2013.01); *F04B 37/14* (2013.01); *F04D 19/042* (2013.01);
(Continued)

(58) Field of Classification Search
CPC ........ F04D 19/04; F04D 19/042; F04B 37/08; F04B 37/14; F01D 25/24; Y02T 50/676; H05K 2201/10409; H05K 1/144; H05K 2201/068; H05K 2201/10189
(Continued)

(56) References Cited

U.S. PATENT DOCUMENTS 7,436,093 B2 * 10/2008 Brunet .................. 310/90.5
7,993,113 B2 * 8/2011 Namiki et al. ............ 417/363
(Continued)

FOREIGN PATENT DOCUMENTS

| EP | 1 005 109 | 5/2000 |
| JP | 2004183631 | 7/2004 |
| JP | 2006250033 | 9/2006 |

OTHER PUBLICATIONS

European Search Report in EP 11 83 4113, dated May 8, 2014.
(Continued)

*Primary Examiner* — Theresa Trieu
(74) *Attorney, Agent, or Firm* — Preti Flaherty Beliveau & Pachios LLP (57) ABSTRACT

A vacuum pump including a pump main unit and a control unit is disclosed. The control unit includes a substrate having electronic elements mounted thereon and terminal pins soldered to the substrate at a first end edge of the substrate. The substrate is mounted to a plate via an attachment near a second end edge opposing the first end edge and the plate is mounted to the pump main unit. The terminal pins extend through the plate. Upon linear thermal expansion of the terminal pins, by reason of the location of the terminal pins near the first end edge and the attachment near the second end edge, stresses in the soldered pin connections are reduced. A molding material having a Shore hardness of less
(Continued)

than 50, is molded around the electronic elements on the substrate in one embodiment.

12 Claims, 7 Drawing Sheets

(51) Int. Cl.
| | |
|---|---|
| *F01D 11/00* | (2006.01) |
| *F01D 25/24* | (2006.01) |
| *F04B 37/08* | (2006.01) |
| *F04B 37/14* | (2006.01) |
| *F04D 19/04* | (2006.01) |
| *F04D 29/64* | (2006.01) |
| *F04D 25/06* | (2006.01) |
| *H05K 3/00* | (2006.01) |
| *H05K 1/14* | (2006.01) |

(52) U.S. Cl.
CPC ......... *F04D 25/0693* (2013.01); *F04D 29/644* (2013.01); *H05K 3/0058* (2013.01); *H05K 1/144* (2013.01); *H05K 2201/068* (2013.01); *H05K 2201/10189* (2013.01); *H05K 2201/10409* (2013.01)

(58) Field of Classification Search
USPC .......... 415/175, 182.1; 417/42, 44.1, 423.4; 310/90.5, 68 R, 71
See application file for complete search history.

(56) References Cited

U.S. PATENT DOCUMENTS

2007/0132327 A1  6/2007  Brunet
2007/0237650 A1  10/2007  Birkenstock et al.

OTHER PUBLICATIONS

First Notice of the Opinion on Examination in Chinese Application No. 2011800487178 (corresponding application to the present application).

* cited by examiner

REDUCING THE INFLUENCE OF THERMAL EXPANSION OF CONNECTOR PINS ON A SUBSTRATE IN A VACUUM PUMP

TECHNICAL FIELD

The present invention relates to a vacuum pump, and particularly relates to a vacuum pump reducing the influence of thermal expansion of connector pins to prevent cracks in soldered parts while preventing damage to electronic elements.

BACKGROUND ART

As a result of the recent development of electronics, there is a rapid increase in the demand for semiconductor devices such as memories and integrated circuits.

Such a semiconductor device is manufactured by doping impurities into a highly pure semiconductor substrate to impart electrical properties thereto, and forming a minute circuit on the semiconductor substrate by etching, for example.

Such operations must be performed in a chamber in a high-vacuum state to avoid the influence of dust or the like in the air. A vacuum pump is generally used to evacuate the chamber. In particular, a turbo-molecular pump, which is a kind of vacuum pump, is widely used since it involves little residual gas and is easy to maintain.

When manufacturing a semiconductor, these are many steps for making various process gases act on a semiconductor substrate, and the turbo-molecular pump is used not only to create a vacuum in a chamber, but also to discharge these process gases from the chamber.

This turbo-molecular pump consists of a pump main unit and a control device for controlling the pump main unit. As a method for simplifying wiring between substrates by reducing the number of pins of connector plugs for connecting the pump main unit and the control device, Patent Literature 1 suggests that a control substrate for a motor and a magnetic bearing should be arranged on the vacuum side.

CITATION LIST

Patent Literature

[Patent Literature 1] Japanese Unexamined Patent Pub. No, 2007-508492

SUMMARY OF INVENTION

Technical Problem

In the case of Patent Literature 1, a cable is used to connect a substrate having electronic elements thereon to a connector. In order to further simplify the wiring, it is desirable to connect the substrate directly to the connector through soldering, without using the cable.

However, when connecting the substrate directly to the connector through soldering, heat is easily accumulated in the pump main unit since the inside thereof is in a vacuum state and it is difficult to release heat through conduction. Accordingly, connector pins linearly expand greatly with the accumulated heat, which leads to possible cracks in solder connection parts.

Further, it is required to prevent the electronic elements mounted on the substrate from damage due to the linear expansion of the connector pins.

The present invention has been made in view of these conventional problems, and an object thereof is to provide a vacuum pump reducing the influence of thermal expansion of connector pins to prevent cracks in soldered parts while preventing damage to electronic elements.

Solution to Problem

Accordingly, the present invention is characterized in including: a substrate on which electronic elements are mounted; a plurality of pins soldered to the substrate so that the pins are arranged near one end edge apart from the center of the substrate; a plate having the pins; and an attachment for attaching the substrate to the plate, in which 5 the attachment is arranged near the other end edge apart from the center of the substrate.

The pins may be retained by the plate by being fixed while directly penetrating the plate, instead of by being inserted into the plate through the body of the terminal. When the pins are fixed while directly penetrating the plate, it is desirable that the parts where the pins are in contact with the plate are insulated depending on the material of the plate.

The pins are arranged near one end edge apart from the center of the substrate. A group of pins functions as a connector. An attachment such as a screw is arranged near the other end edge apart from the center of the substrate, the one end edge and the other end edge facing each other with the center of the substrate therebetween.

Since an attachment is arranged only on the other end side of the substrate and the one end side of the substrate is released from attachments, the bend angle of the substrate can be kept small even when the pins expand with heat, which makes it possible to reduce the stress applied on solder connection parts. Accordingly, the possibility of causing cracks in the solder connection parts is extremely small. Since deforming pressure of the substrate is reduced, influence on the electronic elements can be reduced correspondingly.

Further, the present invention is characterized in that a ratio of a distance from the center of the group of pins to the attachment to a distance from the center of the group of pins to the center of the substrate is 1.5 or greater.

Furthermore, the present invention is characterized in including: a substrate on which electronic elements are mounted; a plurality of pins soldered to the substrate so that the pins are arranged near one end edge apart from the center of the substrate; a plate having the pins; an attachment for attaching the substrate to the plate; and a molding material for molding the electronic elements on the substrate, in which the molding material has a Shore D hardness of less than 50.

The electronic element on the substrate is molded with a molding material such as resin. When the substrate bends, the molding material 243, if having high hardness, is deformed corresponding to the deformation of the substrate. At this time, pressure of the molding material is applied to a fixing leg etc. of the electronic element. When the molding material has high hardness, the electronic element is possibly destroyed when reaction force of the electronic element is not great enough to resist the deforming pressure.

Accordingly, a molding material having a Shore D hardness of less than 50 is selected. Since the molding material flexibly follows the deformation of the substrate, load applied to the electronic element is reduced and reaction force of the electronic element can resist the deforming pressure of the molding material. Therefore, the electronic element cannot be easily destroyed.

Advantageous Effects of Invention

As explained above, according to the present invention, since the attachment is arranged near the other end edge apart from the center of the substrate, the bend angle of the substrate can be kept small even when the pins expand with heat, which makes it possible to reduce the stress applied on solder connection parts. Accordingly, the possibility of causing cracks in the solder connection parts is extremely small. Since deforming pressure of the substrate is reduced, influence on the electronic elements can be reduced correspondingly.

DESCRIPTION OF EMBODIMENTS

Figure 1:
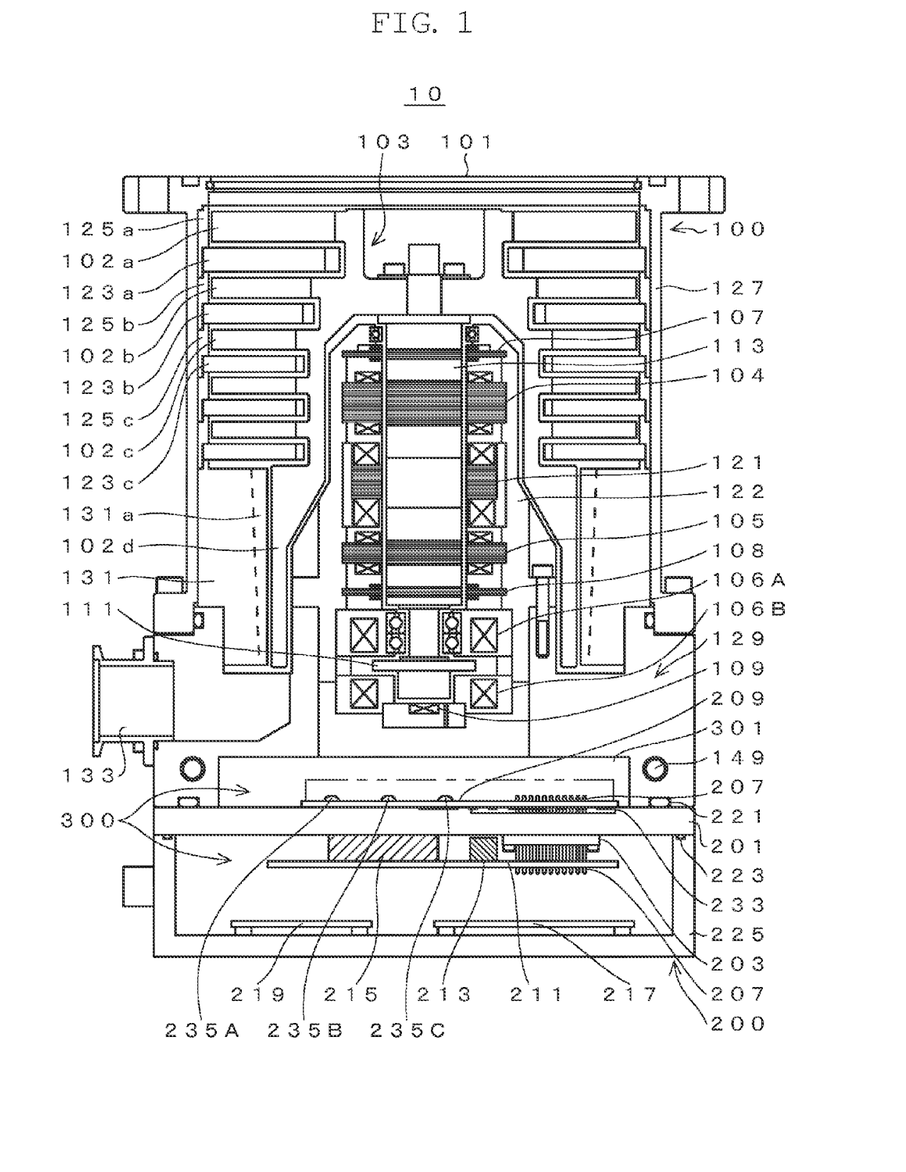
FIG. 1 A block diagram according to an embodiment of the present invention.

Hereinafter, embodiments of the present invention will be explained. FIG. 1 shows a block diagram according to an embodiment of the present invention. In FIG. 1, a turbomolecular pump 10 consists of a pump main unit 100 and a control unit 200 integrated with each other while sandwiching an aluminum plate 201 therebetween.

The plate 201 functions both as the bottom face of the pump main unit 100 and the top face of the control unit 200. However, the plate 201 may be replaced with two plates.

The pump main unit 100 has an inlet port 101 formed at the upper end of an outer cylinder 127. Inside the outer cylinder 127, there is provided a rotor 103 having in its periphery a plurality of rotary blades 102a, 102b, 102c, ... formed radially in a number of stages and constituting turbine blades for sucking and exhausting gas.

A rotor shaft 113 is mounted at the center of the rotor 103, and is levitated and supported in the air and controlled in position by a so-called 5-axis control magnetic bearing, for example.

Four upper radial electromagnets 104 are arranged in pairs in the X and Y axes which are perpendicular to each other and serve as the radial coordinate axes of the rotor shaft 113. An upper radial sensor 107 formed of four electromagnets is provided in close vicinity to and in correspondence with the upper radial electromagnets 104. The upper radial sensor 107 detects a radial displacement of the rotor 103 and transmits the detection result to a control device 300 (mentioned later.)

Based on the displacement signal from the upper radial sensor 107, the control device 300 controls the excitation of the upper radial electromagnets 104 through a compensation circuit having a PID adjusting function, thereby adjusting the upper radial position of the rotor shaft 113.

The rotor shaft 113 is formed of a material having a high magnetic permeability (e.g., iron), and is attracted by the magnetic force of the upper radial electromagnets 104. Such adjustment is performed independently in the X- and Y-axis directions.

Further, lower radial electromagnets 105 and a lower radial sensor 108 are arranged similarly to the upper radial electromagnets 104 and the upper radial sensor 107 to adjust the lower radial position of the rotor shaft 113 similarly to the upper radial position thereof.

Further, axial electromagnets 106A and 106B are arranged with a metal disc 111 vertically sandwiched therebetween, the metal disc 111 having a circular plate-like shape and arranged at the bottom of the rotor shaft 113. The metal disc 111 is formed of a material having a high magnetic permeability, such as iron. An axial sensor 109 is arranged to detect an axial displacement of the rotor shaft 113, and its axial displacement signal is transmitted to the control device 300.

The axial electromagnets 106A and 106B are excitation-controlled based on this axial displacement signal through a compensation circuit having a PID adjusting function in the control device 300. The axial electromagnet 106A and the axial electromagnet 106B attract the metal disc 111 upward and downward respectively by their magnetic force.

In this way, the control device 300 appropriately adjusts the magnetic force exerted on the metal disc 111 by the axial electromagnets 106A and 106B to magnetically levitate the rotor shaft 113 in the axial direction while supporting it in space in a non-contact state.

A motor 121 has a plurality of magnetic poles circumferentially arranged around the rotor shaft 113. Each magnetic pole is controlled by the control device 300 to rotate and drive the rotor shaft 113 through the electromagnetic force acting between the rotor shaft 113 and the magnetic pole.

A plurality of stationary blades 123a, 123b, 123c, ... are arranged apart from the rotary blades 102a, 102b, 102c, ... with small gaps therebetween. The rotary blades 102a, 102b, 102c, ... are inclined by a predetermined angle from a plane perpendicular to the axis of the rotor shaft 113 in order to transfer the molecules of exhaust gas downward through collision.

Similarly, the stationary blades 123 are inclined by a predetermined angle from a plane perpendicular to the axis of the rotor shaft 113, and arranged alternately with the rotary blades 102 so as to extend toward the inner side of the outer cylinder 127.

One ends of the stationary blades 123 are supported while being fitted into the spaces between a plurality of stationary blade spacers 125a, 125b, 125c, ... stacked together.

The stationary blade spacers 125 are ring-like members which are formed of, e.g., aluminum, iron, stainless steel, copper, or an alloy containing some of these metals.

The outer cylinder 127 is fixed on the outer periphery of the stationary blade spacers 125 with a small gap therebetween. A base portion 129 is arranged at the bottom of the outer cylinder 127, and a threaded spacer 131 is arranged between the lower end of the stationary blade spacers 125 and the base portion 129. An exhaust port 133 is formed under the threaded spacer 131 in the base portion 129, and communicates with the exterior.

The threaded spacer 131 is a cylindrical member formed of aluminum, copper, stainless steel, iron, or an alloy containing some of these metals, and has a plurality of spiral thread grooves 131a in its inner peripheral surface.

The direction of the spiral of the thread grooves 131a is determined so that the molecules of the exhaust gas moving in the rotational direction of the rotor 103 are transferred toward the exhaust port 133.

At the lowest end of the rotary blades 102a, 102b, 102c, . . . of the rotor 103, a rotary blade 102d extends vertically downward. The outer peripheral surface of this rotary blade 102d is cylindrical, and extends toward the inner peripheral surface of the threaded spacer 131 so as to be close to the inner peripheral surface of the threaded spacer 131 with a predetermined gap therebetween.

The base portion 129 is a disc-like member constituting the base portion of the turbo-molecular pump 10, and is generally formed of a metal such as iron, aluminum, and stainless steel.

Further, the base portion 129 physically retains the turbo-molecular pump 10 while functioning as a heat conduction path. Thus, it is desirable that the base portion 129 is formed of a metal having rigidity and high heat conductivity, such as iron, aluminum, and copper.

In this configuration, when the rotor shaft 113 is driven by the motor 121 and rotates with the rotary blades 102, exhaust gas from the chamber is sucked in through the inlet port 101 by the action of the rotary blades 102 and the stationary blades 123.

The exhaust gas sucked in through the inlet port 101 flows between the rotary blades 102 and the stationary blades 123 to be transferred to the base portion 129. At this time, the temperature of the rotary blades 102 increases due to frictional heat generated when the exhaust gas comes into contact with or collides with the rotary blades 102, and conductive heat and radiation heat generated from the motor 121, for example. This heat is transmitted to the stationary blades 123 through radiation or conduction by gas molecules of the exhaust gas etc.

The stationary blade spacers 125 are connected together in the outer periphery and transmit, to the outer cylinder 127 and the threaded spacer 131, heat received by the stationary blades 123 from the rotary blades 102, frictional heat generated when the exhaust gas comes into contact with or collides with the stationary blades 123, etc.

The exhaust gas transferred to the threaded spacer 131 is transmitted to the exhaust port 133 while being guided by the thread grooves 131a.

Further, in order to prevent the gas sucked in through the inlet port 101 from entering an electrical component section formed of the motor 121, the lower radial electromagnets 105, the lower radial sensor 108, the upper radial electromagnets 104, the upper radial sensor 107, etc., the electrical component section is covered with a stator column 122, and the inside of this electrical component section is kept at a predetermined pressure by a purge gas.

Next, configuration of the control device 300 will be explained. Electronic elements constituting the control device 300 are stored separately in a bottom space 301 formed between the plate 201 and the base 129 of the pump main unit 100 and in the control unit 200. The inside of the bottom space 301 is set at a vacuum atmosphere, and the inside of the control unit 200 is set at an air atmosphere.

Figure 2:
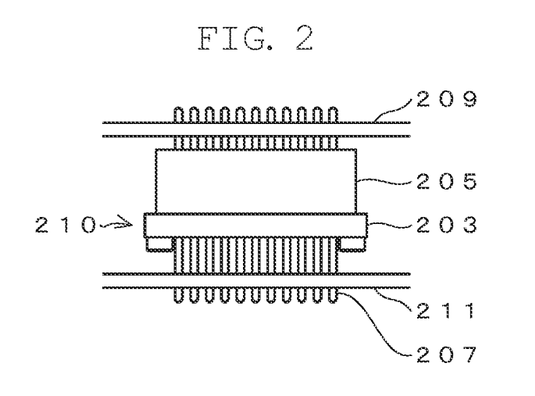
FIG. 2 Terminal structure.

A hole is arranged in a part of the plate 201, and a body 205 of a terminal 210 as shown in FIG. 2 is fixed while penetrating this hole. The body 205 of the terminal 210 has a columnar shape and protrudes from the top face of a roughly-quadrangular bottom plate 203, and many straight pins 207 are fixed while penetrating the body 205 and the roughly-quadrangular bottom plate 203.

The pins 207 may be retained by the plate 201 by being fixed while directly penetrating the plate 201, instead of by being inserted into the plate 201 through the body 205 of the terminal 210. In this case, it is desirable that the parts where the pins 207 are in contact with the plate 201 are insulated depending on the material of the plate 201.

Figure 3:
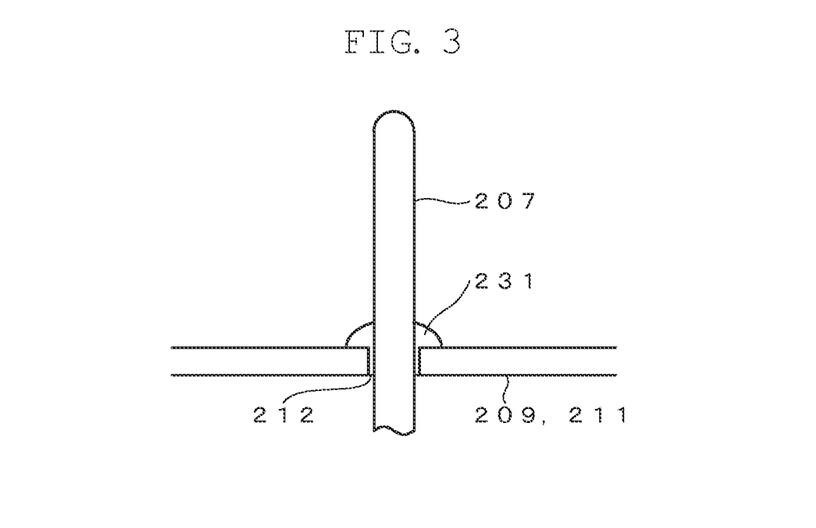
FIG. 3 A diagram showing a pin soldered to a substrate.

The upper parts of the pins 207 are exposed upward from the plate 201 and penetrate pinholes 212 of an AMB control substrate 209. As shown in FIG. 3, the upper parts of the pins 207 are soldered to the AMB control substrate 209 through the pinholes 212 of the AMB control substrate 209. Accordingly, no cable is required between the substrate and the pins, differently from the conventional techniques. Electronic elements for controlling the magnetic bearing are mounted on the AMB control substrate 209.

The pins 207 and the electronic elements on the AMB control substrate 209 are electrically connected through the soldered parts.

On the other hand, the lower parts of the pins 207 are exposed downward from the plate 201 and penetrate the pinholes 212 of an aerial connection substrate 211. As shown in FIG. 3, the lower parts of the pins 207 are soldered to the aerial connection substrate 211 through the pinholes 212 of the aerial connection substrate 211. Electronic elements for controlling the motor 121 are mounted mainly on the aerial connection substrate 211. The pins 207 and the electronic elements on the aerial connection substrate 211 are electrically connected through the soldered parts.

An electrolytic capacitor 213 is arranged near the pins 207 on the aerial connection substrate 211 with its elements facing the plate 201. A heat sink 215 is arranged between the aerial connection substrate 211 and the plate 201. As a result, the AMB control substrate 209, the plate 201, and the aerial connection substrate 211 are integrated into one structure.

Some electronic elements which are not used for controlling the magnetic bearing and the motor are mounted on bottom control substrates 217 and 219. However, instead of arranging the substrates depending strictly on the intended use, electronic elements excepting the electrolytic capacitor 213 may be arbitrarily mounted on the AMB control substrate 209 in the vacuum atmosphere.

In order to achieve drip-proof performance, an O-ring 221 is embedded between the plate 201 and the base 129 while surrounding the bottom space 301, and an O-ring 223 is embedded between the plate 201 and a wall 225 forming the housing of the control unit 200.

Further, a water-cooling pipe is arranged in the base portion 129 near the plate 201 (see a water-cooling pipe 149 in FIG. 1), which makes it possible to cool the plate 201 through the base portion 129.

Next, operation of the control device 300 will be explained.

A substrate unit structure is formed by covering the opening of the casing of the pump main unit 100 with the plate 201 functioning also as the casing of the control unit 200. The pins 207 of the terminal 210 fixed while penetrating the plate 201 are soldered directly to the AMB control substrate 209 and the aerial connection substrate 211 in order to integrate these components. Therefore, only one plate 201 is arranged between the pump main unit 100 and the control unit 200.

By integrating the pump main unit 100 with the control unit 200, the casing and sealing structures can be made simple, differently from the conventional techniques requiring each of the pump main unit 100 and the control unit 200 to have a casing and a sealing member.

Further, by cooling the plate 201 by the water-cooling pipe 149, electronic components mounted respectively on the AMB control substrate 209 in the vacuum atmosphere and the aerial connection substrate 211 in the air atmosphere can be cooled simultaneously. Therefore, the cooling structure can be simplified.

The AMB control substrate 209 is arranged in the bottom space 301 set at the vacuum atmosphere, and electronic elements difficult to place in the vacuum atmosphere are arranged on the aerial connection substrate 211. Since the AMB control substrate 209, the plate 201, and the aerial connection substrate 211 are integrated into one structure through the pins 207, no extra wiring work is required for the substrates.

Since electronic elements for controlling the magnetic bearing are arranged in the bottom space 301 set at the vacuum atmosphere, there is no need to lead the lines of the electromagnets and sensors to the outside, which makes it possible to reduce the number of lines between the AMB control substrate 209 and the aerial connection substrate 211 and the number of pins 207 as much as possible.

Figure 4:
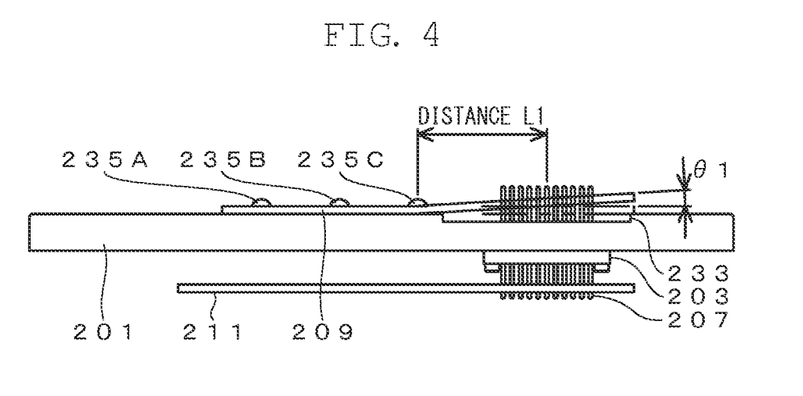
FIG. 4 A diagram showing a bend amount when a screw is arranged near the center of an AMB control substrate.

FIG. 4 is a diagram showing the area including the AMB control substrate 209, the plate 201, and the aerial connection substrate 211. A recess 233 is formed on the plate 201 around the upper parts of the pins 207, corresponding to the shape of the AMB control substrate 209. The AMB control substrate 209 is fixed to the plate 201 at several points by screws 235A, 235B, and 235C serving as attachments.

In FIG. 4, the screws 235A, 235B, and 235C are arranged only on the left of the pins 207. The screw 235A is arranged near the left edge of the AMB control substrate 209, and the screw 235C is arranged approximately at the center of the AMB control substrate 209.

In the configuration of FIG. 4, there is a fear that the pins 207 linearly expands with the heat accumulated in the bottom space 301 and makes the AMB control substrate 209 suddenly bend by an angle θ1 from the screw 235C as a fulcrum. The bottom space 301 is heated quite easily since it is in the vacuum environment. In this case, the distance between the center of the group of pins 207 and the screw 235C is defined as L1.

Figure 5:
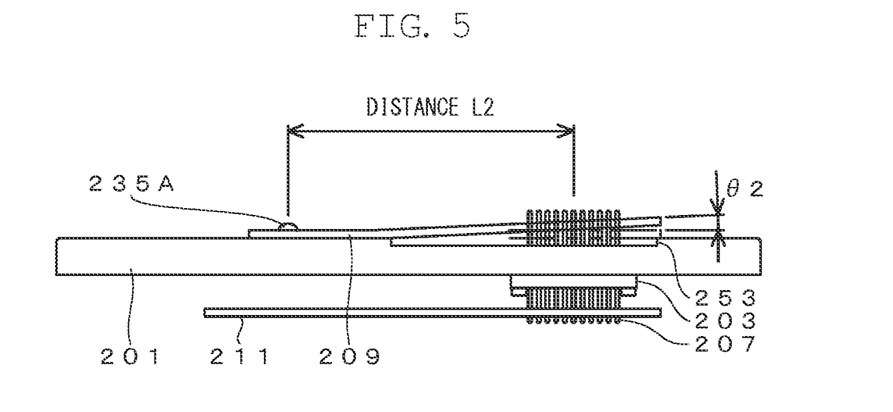
FIG. 5 A diagram showing a method for reducing a bend angle.

As shown in FIG. 5, the bend angle of the AMB control substrate 209 is reduced by omitting the screw 235B and 235C while keeping only the screw 235A. Since no screw is arranged on the right of the screw 235A, the AMB control substrate 209 is released toward the right.

In this case, the AMB control substrate 209 bends by an angle θ2 from the screw 235A as a fulcrum, but this bend angle is gradual, which means that the possibility of causing cracks in the solder connection parts is extremely small. Here, the distance between the center of the group of pins 207 and the screw 235A is defined as L2. Both in FIG. 4 and FIG. 5, the pins 207 linearly expand with the heat accumulated in the bottom space 301, similarly. Therefore, the relationship as shown in Formula 1 is established.

$$L1 \times \tan θ1 = L2 \times \tan θ2 \quad \text{[Formula 1]}$$

Here, a bend reduction α is defined as θ1/θ2. When the angle θ is tiny, the bend reduction α can be expressed as in Formula 2.

$$\alpha = \frac{θ1}{θ2} \doteq \frac{L2}{L1} \quad \text{[Formula 2]}$$

The bend reduction α is effective when it is 1.5 or greater. It is more desirable that the bend reduction α is 1.7 or greater, and still more desirably, 2 or greater.

A recess 253 is expanded to the left beyond the left edge of the recess 233, to have a larger area than the recess 233.

By making the recess 253 broader, the AMB control substrate 209 bends smoothly since the AMB control substrate 209 can be prevented from adhering to the plate 201 due to any deposit etc.

Next, influence of the bend on the electronic elements mounted on the AMB control substrate 209 will be discussed.

Figure 6:
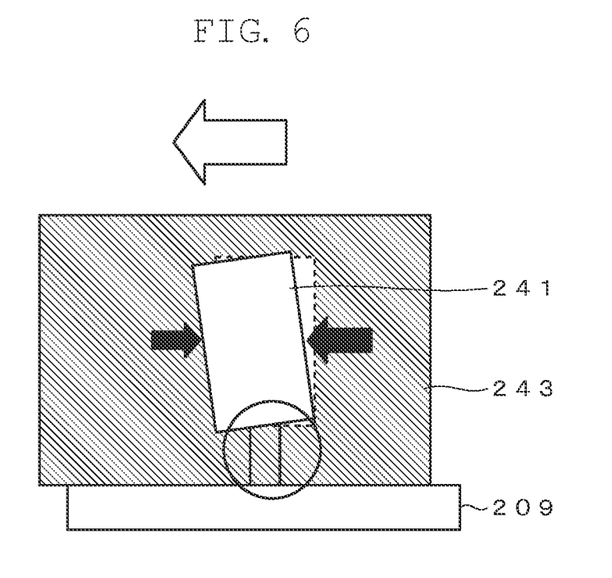
FIG. 6 A diagram showing an electronic element when a molding material having high hardness is used.

As shown in FIG. 6, an electronic element 241 on the AMB control substrate 209 is molded with a molding material 243 such as resin. As stated above, when the AMB control substrate 209 bends, the molding material 243, if having high hardness (e.g., as when using Araldite 2012 (trade name) produced by Huntsman), is largely deformed corresponding to the deformation of the substrate. At this time, great deforming pressure of the molding material is applied to a fixing leg etc. of the electronic element 241, as shown with a thick arrow in the drawing. When the molding material 243 has high hardness, the electronic element 241 is possibly destroyed when reaction force of the electronic element 241 is not great enough to resist the deforming pressure.

Figure 7:
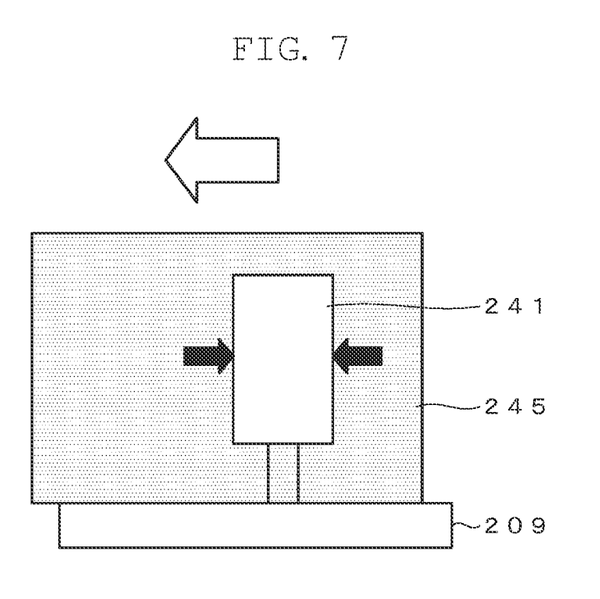
FIG. 7 A diagram showing the electronic element when a molding material having low hardness is used.

Accordingly, as shown in FIG. 7, a molding material 245 having low hardness (e.g., DELO-DUOPDX CR804 (trade name) having a Shore D hardness of 43) is selected. It is desirable that the molding material 245 has a Shore D hardness of less than 50.

In this case, since load applied to the electronic element 241 is reduced as shown with a thick arrow in the drawing, reaction force of the electronic element 241 can resist the deforming pressure of the molding material 245. Therefore, the electronic element 241 cannot be easily destroyed.

REFERENCE SIGNS LIST

10: Turbo-molecular pump
100: Pump main unit
102: Rotary blades
104: Upper radial electromagnets
105: Lower radial electromagnets
106A, B: Axial electromagnets
107: Upper radial sensor
108: Lower radial sensor
109: Axial sensor
111: Metal disc
113: Rotor shaft
121: Motor
122: Stator column
123: Stationary blades
125: Stationary blade spacers
127: Outer cylinder
129: Base portion
131: Spacer
133: Exhaust port
149: Water-cooling pipe
200: Control unit
201: Plate
203: Roughly-quadrangular bottom plate
205: Body
207: Pins
209: AMB control substrate
210: Terminal
211: Aerial connection substrate 212: Pinholes
213: Electrolytic capacitor
215: Heat sink
221, 223: O-rings
233, 253: Recesses
235A, 235B, 235C: Screws
241: Electronic element
243, 245: Molding material
300: Control device
301: Bottom space

The invention claimed is:

1. A vacuum pump comprising:
a pump main unit having a rotor and sucking a as by rotation of the rotor; and
a control unit configured to control rotation of the rotor;
the control unit further comprising:
a substrate on which electronic elements are mounted;
a plurality of straight pins soldered to the substrate so that the plurality of straight pins are arranged near a first end edge apart from a center of the substrate;
a plate having the plurality of straight pins; and
an attachment attaching the substrate to the plate, wherein the attachment is arranged near a second end edge apart from the center of the substrate.

2. The vacuum pump of claim 1, wherein a ratio of a distance from a center of a group of the plurality of straight pins to the attachment to a distance from the center of the group of the plurality of straight pins to the center of the substrate is 1.5 or greater.

3. The vacuum pump of claim 1 wherein the pump main unit includes magnetic bearings and the electronic elements are configured to control the magnetic bearings within the pump main unit to support the rotor.

4. The vacuum pump of claim 1 wherein the electronic elements are configured to control the rotation of the rotor within the pump main unit.

5. The vacuum pump of claim 1 wherein the control unit is configured to control the rotation of the rotor to create a vacuum atmosphere in an area within the pump main unit and wherein the substrate is disposed within the area within the pump main unit having the vacuum atmosphere.

6. The vacuum pump of claim 1 wherein the pump main unit has an inlet port and an exhaust port, the control unit is configured to produce rotation of the rotor to suck the gas into the pump main unit through the inlet port and to exhaust the gas from the pump main unit through the exhaust port, the electronic elements are configured to control at least one aspect of an operation of the pump main unit, and the plurality of straight pins are electrically coupled to the electronic elements.

7. A vacuum pump comprising:
a pump main unit having a rotor and sucking a gas by rotation of the rotor; and
a control unit configured to control rotation of the rotor;
the control unit further comprising:
a substrate on which electronic elements are mounted;
a plurality of pins soldered to the substrate so that the plurality of pins are arranged near an end edge apart from a center of the substrate;
a plate having the plurality of pins;
an attachment attaching the substrate to the plate; and
a molding material for molding the electronic elements on the substrate,
wherein the molding material has a Shore D hardness of less than 50.

8. The vacuum pump of claim 7 wherein the pump main unit includes magnetic bearings and the electronic elements are configured to control the magnetic bearings within the pump main unit to support the rotor.

9. The vacuum pump of claim 7 wherein the electronic elements are configured to control the rotation of the rotor within the pump main unit.

10. The vacuum pump of claim 7 wherein the control unit is configured to control the rotation of the rotor to create a vacuum atmosphere in an area within the pump main unit and wherein the substrate is disposed within the area within the pump main unit having the vacuum atmosphere.

11. The vacuum pump of claim 7 wherein the pump main unit has an inlet port and an exhaust port, the control unit is configured to produce rotation of the rotor to suck the gas into the pump main unit from the inlet port and to exhaust the gas from the pump main unit through the exhaust port, the electronic elements are configured to control at least one aspect of an operation of the pump main unit, and the plurality of pins are electrically coupled to the electronic elements.

12. A vacuum pump comprising:
a pump main unit having a rotor; and
a control unit configured to produce rotation of the rotor within the pump main unit to create an area having a vacuum atmosphere within the pump main unit; and
a plate mounted to the pump main unit and at least partially defining the area having the vacuum atmosphere;
the control unit further comprising:
a substrate disposed within the area having the vacuum atmosphere and having electronic elements mounted thereon for controlling at least one aspect of the operation of the pump main unit, wherein the substrate includes a center and first and second opposed end edges;
a plurality of straight pins extending through the plate, soldered to the substrate and in electrical communication with the electronic elements, the plurality of straight pins being disposed near the first end edge and spaced from the center of the substrate; and
an attachment for attaching the substrate to the plate,
wherein a first end of the substrate adjacent the first end edge having the straight pins soldered thereto is not affixed to the plate so as to permit flexing of the first end of the substrate in response to linear expansion of the plurality of straight pins and wherein a second end of the substrate adjacent the second end edge is fixedly mounted to the plate via the attachment.

* * * * *